(12) United States Patent
Lu et al.

(10) Patent No.: US 10,192,763 B2
(45) Date of Patent: Jan. 29, 2019

(54) METHODOLOGY FOR CHAMBER PERFORMANCE MATCHING FOR SEMICONDUCTOR EQUIPMENT

(71) Applicant: Applied Materials, Inc., Santa Clara, CA (US)

(72) Inventors: Xuesong Lu, Santa Clara, CA (US); Lin Zhang, San Jose, CA (US); Andy Le, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 459 days.

(21) Appl. No.: 14/875,673

(22) Filed: Oct. 5, 2015

(65) Prior Publication Data
US 2017/0098565 A1    Apr. 6, 2017

(51) Int. Cl.
*H01L 21/67* (2006.01)
*C23C 16/52* (2006.01)
(Continued)

(52) U.S. Cl.
CPC ........ *H01L 21/67253* (2013.01); *C23C 16/50* (2013.01); *C23C 16/52* (2013.01); *G05B 19/4189* (2013.01); *G05B 19/41875* (2013.01); *H01J 37/3211* (2013.01); *H01J 37/32091* (2013.01); *H01J 37/32449* (2013.01); *H01J 37/32522* (2013.01); *H01J 37/32935* (2013.01); *G05B 2219/37008* (2013.01); *G05B 2219/45032* (2013.01); *G05B 2219/50388* (2013.01); *H01J 2237/327* (2013.01); *H01J 2237/3321* (2013.01); *H01J 2237/3323* (2013.01)

(58) Field of Classification Search
None
See application file for complete search history.

(56) References Cited

U.S. PATENT DOCUMENTS 7,153,709 B1    12/2006  Purdy et al.
7,275,013 B1 *   9/2007  Mattis ................. G01F 1/64
                                            324/160

(Continued)

OTHER PUBLICATIONS

Written Opinion and International Search Report from PCT/US2016/049584 dated Nov. 30, 2016.

*Primary Examiner* — Tuan C Dao
(74) *Attorney, Agent, or Firm* — Patterson + Sheridan, LLP

(57) ABSTRACT

Embodiments of the present disclosure provide methodology to match and calibrate processing chamber performance in a processing chamber. In one embodiment, a method for calibrating a processing chamber for semiconductor manufacturing process includes performing a first predetermined process in a processing chamber, collecting a first set of signals transmitted from a first group of sensors disposed in the processing chamber to a controller while performing the predetermined process, analyzing the collected first set of signals, comparing the collected first set of signals with database stored in the controller to check sensor responses from the first group of sensors, calibrating sensors based on the collected first set of signals when a mismatch sensor response is found, subsequently performing a first series of processes in the processing chamber, and collecting a second set of signals transmitted from the sensors to the controller while performing the series of processes.

17 Claims, 4 Drawing Sheets

(51) Int. Cl.
*G05B 19/418* (2006.01)
*H01J 37/32* (2006.01)
*C23C 16/50* (2006.01)

(56) References Cited

U.S. PATENT DOCUMENTS

| | | | |
|---|---|---|---|
| 8,173,451 B1* | 5/2012 | Tian | H01J 37/32963 156/345.22 |
| 2002/0111041 A1* | 8/2002 | Annapragada | G03F 7/427 438/784 |
| 2002/0119660 A1* | 8/2002 | Sarfaty | H01L 22/26 438/689 |
| 2003/0032207 A1* | 2/2003 | Rengarajan | H01J 37/321 438/14 |
| 2003/0210901 A1 | 11/2003 | Donald et al. | |
| 2005/0190381 A1 | 9/2005 | Mui et al. | |
| 2007/0095789 A1 | 5/2007 | Davis et al. | |
| 2009/0030632 A1 | 1/2009 | Tallavarjula et al. | |
| 2009/0147819 A1* | 6/2009 | Goodman | G01K 15/00 374/1 |
| 2013/0222055 A1* | 8/2013 | Coumou | H03F 1/0211 330/75 |

* cited by examiner

| REQUIREMENTS | TOLERANCE |
| --- | --- |
| DEPOSITION RATE (Å/min)* | TARGET NUMBER ± 5% |
| REFRACTIVE INDEX AT 633 nm WAVELENGTH | TARGET NUMBER ± 1% |
| EXTINCTION COEFFICIENT AT 633nm WAVELENGTH | TARGET NUMBER ± 3% |
| STRESS | TARGET NUMBER ± 10% |
| WAFER - TO -WAFER THICKNESS NON-UNIFORMITY (R/2 %) | TARGET NUMBER ± <2.0% |

FIG. 4

METHODOLOGY FOR CHAMBER PERFORMANCE MATCHING FOR SEMICONDUCTOR EQUIPMENT

BACKGROUND

Field

Embodiments of the present disclosure generally relate to a methodology for detecting process performance in a processing chamber, more particularly, a methodology for detecting process performance in a processing chamber to chamber-to-chamber matching for semiconductor manufacturing and factory management.

Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Typically, devices on semiconductor substrates are manufactured by a sequence of lithographic processing steps in which the devices are formed from a plurality of overlying layers, each having an individual pattern. Generally, a set of 15 to 100 masks is used to construct a chip and can be used repeatedly.

Between one layer and the next layer that overlays the previous one, the individual patterns of the one layer and the next layer must be aligned. A measurement of alignment marks may be obtained by a metrology tool which is then used by a lithography tool to align the subsequent layers during exposure and again after a lithography process to recheck a performance of the alignment. However, overlay errors (or pattern registration errors) between layers are inevitable, and error budgets are calculated by IC designers for which the manufacturing must meet. Overlay errors of the device structure may originate from different error sources, such as overlay errors from previous exposure tool/metrology tool, current exposure tool/metrology tool, underlying film layer property mismatch, a matching error among metrology tool or processing chambers that may result in deposited film property difference, or mismatched baseline setting of the processing chambers utilized to process different film layers formed on the substrate and the like.

With the shrink of critical dimensions (CD), overlay error in the critical layers of the device structure must be minimal or eliminated in order to reliably produce devices with minimal feature sizes, such as a width of a control gate in a device. To eliminate the likelihood of overlay errors, a single processing chamber dedicated to manufacture certain film layers on the same substrate is often requested in an attempt to eliminate tool to tool manufacturing errors or mismatch. However, this approach often creates logistic problems and adversely increases manufacture cycle time. Furthermore, overlay specifications have become more challenging that the film property mismatch contributions (i.e., film refractive index or extinctive coefficient) to overlay errors may alone exceed the error budget. In semiconductor manufacturing, the production processing equipment used must be controlled with minimum mismatch such that its variables generated from each tool stay within certain operational limits. Failure to remain within operational limits in each processing chambers in the production line can easily cause the loss of, or damage to, the device and/or wafer being processed utilizing different processing chambers at different manufacturing stage.

Therefore, there exists a need for improved methodology to correct and match baseline of the processing chambers in the production line with minimum process variable mismatch so as to improve device performance and maintain predicable product reliability, consistency and yield.

SUMMARY

Embodiments of the present disclosure provide methodology to match and calibrate processing chamber performance in a processing chamber. In one embodiment, a method for calibrating a processing chamber for semiconductor manufacturing process includes performing a first predetermined process in a processing chamber, collecting a first set of signals transmitted from a first group of sensors disposed in the processing chamber to a controller while performing the predetermined process, analyzing the collected first set of signals, comparing the collected first set of signals with database stored in the controller to check sensor responses from the first group of sensors, calibrating sensors based on the collected first set of signals when a mismatch sensor response is found, subsequently performing a first series of processes in the processing chamber, and collecting a second set of signals transmitted from the sensors to the controller while performing the series of processes.

In another embodiment, a computer-readable storage medium storing a program, which, when executed by a processor performs an operation for operating a processing chamber, the operation comprises performing a first hardware calibration process by calibrating sensors in a processing chamber based on sensor responses collected and analyzed from operating a first predetermined process in the processing chamber, and performing a second hardware calibration process by calibrating the sensors in the processing chamber based on sensor responses collected and analyzed from operating a first set of processes in the processing chamber.

In yet another embodiment, a processing system includes a controller coupled to a processing chamber, the controller comprising a system memory containing instructions and a processor, the processor configured to cause the processing chamber to perform a method when executing the instructions, the method comprises receiving a first set of signals transmitted from a processing chamber when performing a first predetermined process in the processing chamber, analyzing the collected first set of signals, comparing the collected first set of signals with database stored in the controller to check sensor responses from the first group of sensors, calibrating sensors based on the collected first set of signals when a mismatch sensor response is found, subsequently performing a first series of processes in the processing chamber and collecting a second set of signals transmitted from the sensors to the controller while performing the series of processes.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 4 depict a table listing exemplary film properties controlled at a desired tolerance/limit after a chamber calibration process is completed.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiment of the present disclosure provides a methodology for detecting a performance in a processing chamber and efficiently matching the processing chamber performance to a standard requirement set in a manufacturing production line. The methodology provides a systematic detecting procedure including a hardware matching procedure and an on-wafer result matching procedure. The methodology as provided may efficiently and quickly detect the mismatched items occurred during a process, either due to the hardware settings, hardware implement errors, software setting, sensor faults or process parameter setting matches, or the like, so as to quickly calibrate and correct the mismatch in the processing chamber. Thus, after performing a sequence of the matching procedures, the processing chamber performance and sensor settings may be matched to a standard setting used for other processing chambers in the production line, thus eliminating and reducing the likelihood of chamber mismatch among the processing chambers of the production line and promoting process accuracy.

Figure 1:
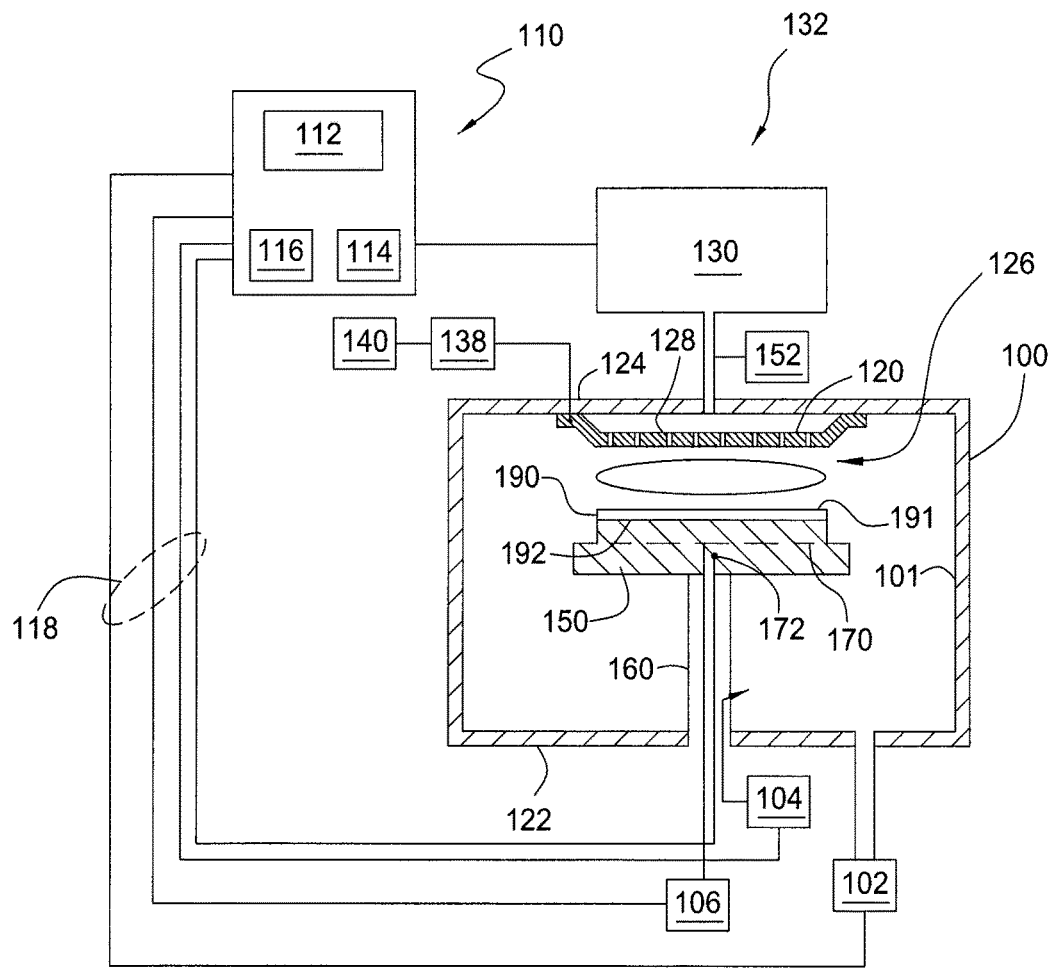
FIG. 1 depicts a plasma processing chamber which may be utilized to perform a process on a substrate.

FIG. 1 is a cross sectional view of an illustrative processing system 132 suitable for performing a selective oxidation process as further described below. The processing system 132 may be a CENTURA®, and Producer® SE or Producer® GT deposition systems, all available from Applied Materials Inc., Santa Clara, Calif. It is contemplated that other processing systems, including those available from other manufacturers, may be adapted to practice the invention.

The processing system 132 includes a processing chamber 100 coupled to a gas panel 130 and a controller 110. The processing chamber 100 generally includes a top 124, a side 101 and a bottom wall 122 that define an interior volume 126.

A support pedestal 150 is provided in the interior volume 126 of the chamber 100. The pedestal 150 may be fabricated from aluminum, ceramic, and other suitable materials. In one embodiment, the pedestal 150 is fabricated by a ceramic material, such as aluminum nitride, which is a material suitable for use in a high temperature environment, such as a plasma process environment, without causing thermal damage to the pedestal 150. The pedestal 150 may be moved in a vertical direction inside the chamber 100 using a lift mechanism (not shown).

The pedestal 150 may include an embedded heater element 170 suitable for controlling the temperature of a substrate 190 supported on the pedestal 150. In one embodiment, the pedestal 150 may be resistively heated by applying an electric current from a power supply 106 to the heater element 170. In one embodiment, the heater element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the heater element 170, thereby maintaining the substrate 190 and the pedestal 150 at a substantially constant temperature during film deposition at any suitable temperature range. In another embodiment, the pedestal 150 may be maintained at room temperature as needed. In yet another embodiment, the pedestal 150 may also include a chiller (not shown) as needed to cool the pedestal 150 at a range lower than room temperature as needed. The supplied electric current may be adjusted to selectively control the temperature of the pedestal 150 between about 100 degrees Celsius to about 900 degrees Celsius, such as between about 300 degrees Celsius and about 800 degrees Celsius.

A temperature sensor 172, such as a thermocouple, may be embedded in the support pedestal 150 to monitor the temperature of the pedestal 150 in a conventional manner. The measured temperature is used by the controller 110 to control the power supplied to the heater element 170 to maintain the substrate at a desired temperature.

A vacuum pump 102 is coupled to a port formed in the walls 101 of the chamber 100. The vacuum pump 102 is used to maintain a desired gas pressure in the processing chamber 100. The vacuum pump 102 also evacuates post-processing gases and by-products of the process from the chamber 100.

A showerhead 120 having a plurality of apertures 128 is coupled to the top 124 of the processing chamber 100 above the substrate support pedestal 150. The apertures 128 of the showerhead 120 are utilized to introduce process gases into the chamber 100. The apertures 128 may have different sizes, number, distributions, shape, design, and diameters to facilitate the flow of the various process gases for different process requirements. The showerhead 120 is connected to the gas panel 130 that allows various gases to supply to the interior volume 126 during process. A plasma is formed from the process gas mixture exiting the showerhead 120 to enhance thermal decomposition of the process gases resulting in the deposition of material on a surface 191 of the substrate 190.

The showerhead 120 and substrate support pedestal 150 may be formed a pair of spaced apart electrodes in the interior volume 126. One or more RF power sources 140 provide a bias potential through a matching network 138 to the showerhead 120 to facilitate generation of a plasma between the showerhead 120 and the pedestal 150. Alternatively, the RF power sources 140 and matching network 138 may be coupled to the showerhead 120, substrate support pedestal 150, or coupled to both the showerhead 120 and the substrate support pedestal 150, or coupled to an antenna (not shown) disposed exterior to the chamber 100. In one embodiment, the RF power sources 140 may provide between about 10 Watts and about 3000 Watts at a frequency of about 30 kHz to about 13.6 MHz.

An optional water vapor generating (WVG) system 152 is coupled to the processing system 132 that is in fluid communication to the interior volume 126 defined in the processing chamber 100. The WVG system 152 generates ultra-high purity water vapor by means of a catalytic reaction of $O_2$ and $H_2$. In one embodiment, the WVG system 152 has a catalyst-lined reactor or a catalyst cartridge in which water vapor is generated by means of a chemical reaction. The catalyst may include a metal or alloy, such as palladium, platinum, nickel, combinations thereof and alloys thereof.

The controller 110 includes a central processing unit (CPU) 112, a memory 116, and a support circuit 114 utilized to control the process sequence and regulate the gas flows from the gas panel 130 and the WVG system 152. The CPU 112 may be of any form of a general purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the processing system 132 are handled through numerous signal cables collectively referred to as signal buses 118, some of which are illustrated in FIG. 1.

Figure 2:
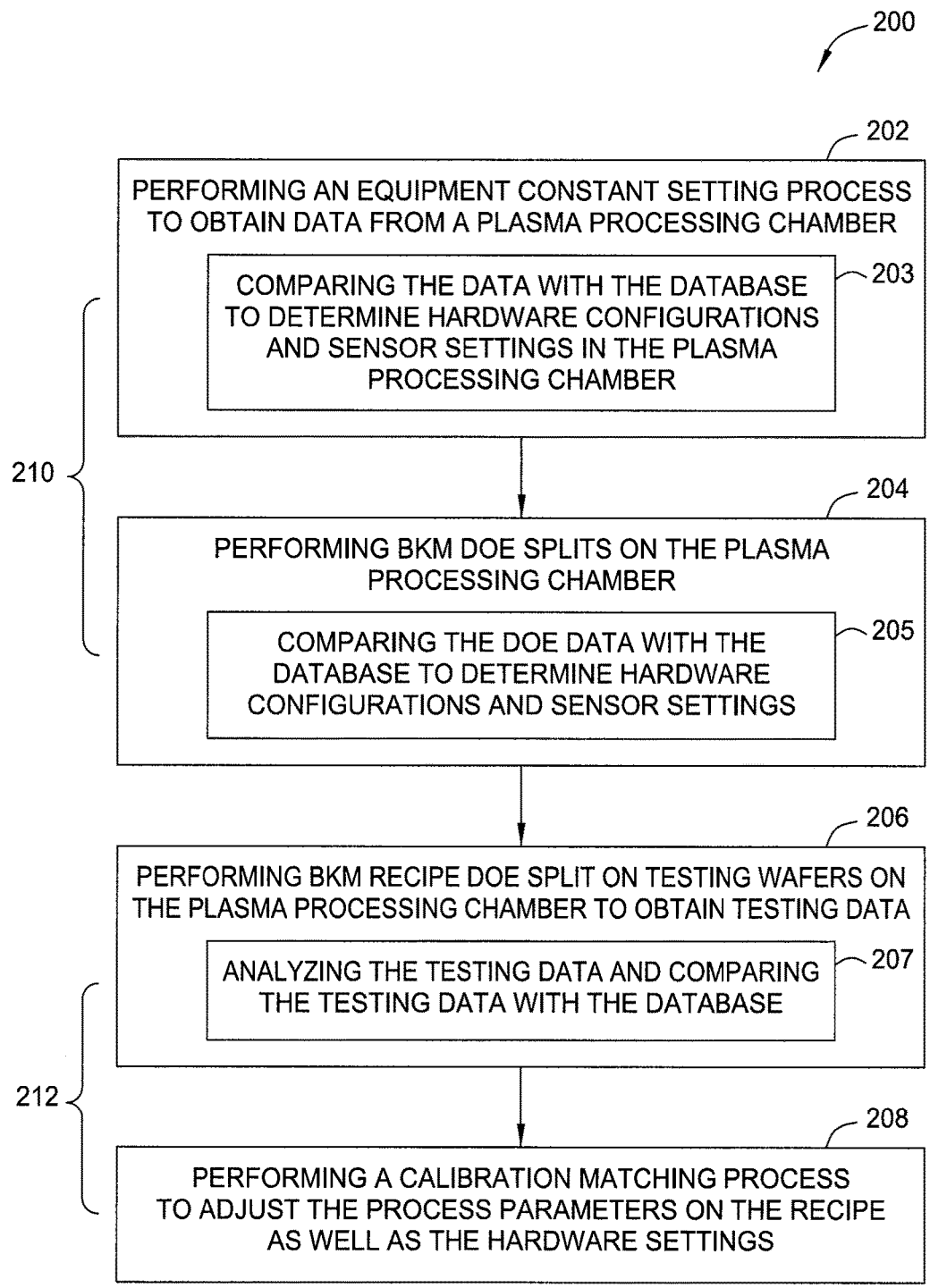
FIG. 2 is a flow diagram of a method for calibration and matching processing chamber performance to a desired standard in accordance with one embodiment of the present disclosure.

FIG. 2 is a flow diagram of one embodiment of a method 200 for determining and/or calibrating a baseline of a processing chamber, such as the processing chamber 100 depicted in FIG. 1, so as to match the baseline of the processing chamber to a required level (e.g., a fabrication standard for all processing chambers required to be matched to) in a semiconductor manufacturing production line. The processing chamber 100 may be a new implement and/or new assembled processing chamber positioned in the production line. Alternatively, the processing chamber 100 may be an existing processing chamber in the production line that its process performance is required to be calibrated and troubleshot to match to the industrial or set standard in the production line.

The method 200 begins at block 202 by performing a predetermined process, such as a BKM (best-known method) process in the processing chamber 100. The BKM process may be a deposition process, etching process, a coating process or any suitable processes that the processing chamber 100 of interest is configured to later perform when the baseline calibration and/or matching process is completed and the processing chamber is released to the production line for processing production substrates. In one example, the BKM process performed here is a CVD deposition process, such as a deposition process configured to form an amorphous carbon layer, a silicon oxide layer, a silicon layer, a silicon nitride layer, a low-k material or other suitable materials.

In the example wherein the processing chamber 100 is configured to perform a single layer deposition process to form a single layer on the substrate, a single layer recipe may be selected to be performed for sensor value match and sensor response match as well as process response match. In the example wherein the processing chamber 100 is configured to perform dual layers, multiple layers, or a composite structure deposition process to form dual layers/a composite structure on the substrate, multi-layer recipes may be selected to sequentially or repeatedly performed for sensor value matching and sensor response matching as well as process response matching. For example, when a single layer is desired to be formed on the substrate, a one-time deposition process may be performed using a single layer recipe stored in the controller 110. Alternatively, when multiple layers (e.g., staircase structures for 3D memory gate applications including a first layer and a second layer repeatedly formed on a substrate until a desired thickness is reached) are desired to be formed on the substrate, a cycled or looped multi-layer recipe deposition process may be performed using selected multiple different deposition recipes (e.g., a first deposition recipe for forming the first layer and a second deposition recipe for forming the second layer in the staircase structure as an example) stored in the controller 110.

During the operation of block 202, sensors and/or detectors, such as MFC (mass flow controller), optical emission spectroscopy (OES), RF signal detector, pressure detector, or suitable sensors or detectors associated with the processing chamber, may be detected for matching. In operation, sensors may transmit signals to the controller, such as the controller 110 depicted in FIG. 1, for the analysis for matching to a desired value setting. One example of the controller 110 which may be adapted to control the operations of the processing chamber 100 in accordance with the disclosure is the Advanced Process Control (APC) E3™ statistical process control module made available by Applied Materials, Inc., of Santa Clara, Calif. The sensors as detected and signals as transmitted from the sensors may include process parameters and sensor responses, such as gas flow rate, process pressure, RF power signals, substrate temperature, RF feedback signal, ion concentration and other suitable signals that may be collected during the process of block 202. At a sub-block 203 in the block 202, the controller 110 may compare and analyze the signals received during operations of the processing chamber 100 to perform a sensor value/response match procedure.

In one example, the signals transmitted from the sensors received by the controller 110 is compared and analyzed with the data stored in the database library. The signals may be monitored and downloaded from the E3™ statistical process control module in the controller 110 and analyzed in-time or offline as needed. The database library may be stored in the memory 116 of the controller 110 or from other statistical process control (SPC) database stored in the manufacturing facility or EDA (electronic design automation) system. The data stored in the database library may be obtained from historical values of chamber parameters from past processing runs in other processing chambers or from a standard processing chamber (e.g., or called Golden Chamber) configured in the production line for production that allows other processing chambers in the production to match their sensor values/response thereto. Standard values (e.g., a specification) of the chamber parameters and hardware settings may be determined and selected from these historical values of chamber parameters to best suit each process performed in the processing chamber.

Thus, after the received signals are analyzed and compared at sub-block 203, deviation and mismatched values/response from the sensors of the target processing chamber, such as the processing chamber 100, may be found. Subsequently, a correction/calibration process is then performed to match the value/response of sensors of the processing chamber 100 to the predetermined standard values.

Figure 3B:
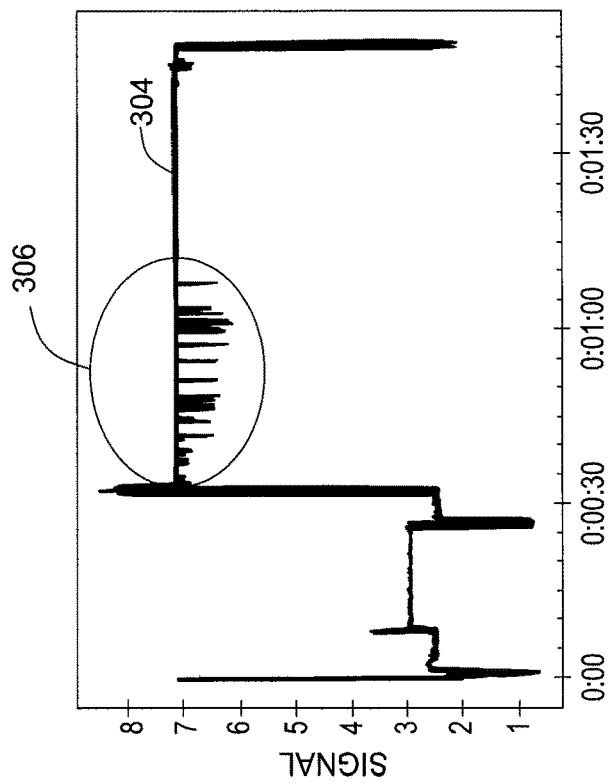
FIGS. 3A-3B depict trace lines depicting chamber parameters received during operation of the processing chamber in accordance with embodiments of the present disclosure.
Figure 3A:
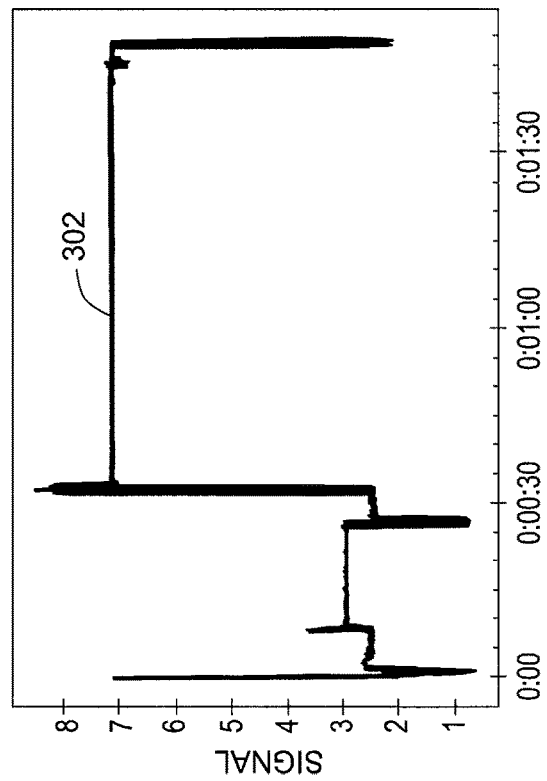

For example, FIGS. 3A and 3B depict trace lines 302, 304 of signals of one of the sensors detected during the BKM run from a standard/calibrated processing chamber and the processing chamber 100 of interest at block 202 respectively. In the trace line 302 in FIG. 3A, the signal as detected from the standard/calibrated processing chamber indicates a sharp and clear signal without significant interference over time. In contrast, the trace line 304 in FIG. 3B indicates that a significant noise found as the process proceeded, as shown by circle 306. The noise may come from chamber instability, incorrect chamber parameter settings, sensor faults, defective sensors, chamber component defect, incompatible chamber part, and the like, thus eventually leading to system error or likely particle generation during operation. Thus, the signal as detected may help the technicians to quickly trouble-shoot and correct the sensor errors and problems. After the calibration/matching process, the values transmitted from sensors may be set and tuned to a desired value and performance.

At block 204, after the BKM process is performed, a DOE (design of experiment) split run is performed to execute processes with different process windows in the processing chamber 100 of interest. The DOE split run may help detect variations of chamber performance from different sensors when the processing chamber 100 is operated at different settings of process parameters, which may provide a wider process window for the processes performed in the processing chamber 100.

In one example, the DOE split run typically includes 5 test samples which include the process parameters set in BKM setting, 20% above and below the BKM settings, and 10% above and below the BKM setting. It is noted that the DOE split run may be in any number greater than 2. After the DOE split run, all signals transmitted from the sensors in the processing chamber 100 of interest is then collected, monitored, analyzed, and compared to the standard value stored in the database in sub-block 205. The operation in sub-block 205 is similar to the operation in sub-block 203 with the number of the test samples are different (e.g., one sample data in sub-block 203 for BKM process run and multiple sample data in sub-block 205 for obtaining wider process parameter coverage as compared to the from BKM).

Furthermore, during operation in sub-block 205, a sensor to sensor response calibration is performed. In each split run, at least one of the process parameters or sensor settings is changed so that at least one sensor response corresponding to the process parameter change or sensor setting will be obtained. The sensor response as described here may include any detected signals, result or response in any suitable forms, such as chamber parameter values, variables or any detected numbers. It is noted that more than one process parameters or sensor setting may be changed as needed.

After the sensor response is obtained, the sensor response is then analyzed and compared with the desired standard in the database. Each sensor response is compared with the standard value from the primary sensors in each DOE splits (e.g., variables set in the DOE splits). When the mismatch is found, the defective sensor is quickly found and identified. Thus, a corresponding sensor calibration or sensor replacement process will perform to calibrate the performance of the specific sensor at question or replace the specific sensor to match the standard sensor performance as desired. The sensor calibration procedure is an efficient trouble shooting process utilized to quickly identify the defective sensors for replacement or calibration, fix the issues, abnormality or errors occurring in the processing chamber 100. After each sensor response is compared, analyzed and calibrated, the sensor calibration procedure utilizing the BKM split process at operation 204 is then considered completed.

It is noted that the operations of blocks 202 and 204 belong to hardware matching procedures, as indicated by the bracket 210 depicted in FIG. 2. Thus, most of the hardware errors may be found in these two operations, such as sensor fault, chamber setting errors, and the like. For the later described operations of blocks 206, 208, belong to on-wafer result matching procedures, as indicated by the bracket 212 depicted in FIG. 2, which indicates that the chamber parameters and setting are fine-tuned or adjusted based on the data/result measured from film layers formed on semiconductor wafers processed in the processing chamber 100 of interest.

At block 206, the hardware setting and chamber parameters are corrected and calibrated, a DOE (design of experiment) split run is performed to execute processes with different process windows to form film layers with different levels of film properties in the processing chamber 100 of interest. This DOE split run may enable the processing chamber to form film layers with predetermined different film properties, thus providing a wider process window for the processes performed in the processing chamber 100 when forming film layers with similar film properties.

In one example, the DOE split run typically includes 5 test samples which include samples run at process parameters set at the BKM setting, 20% above and below the BKM settings, and 10% above and below the BKM setting. It is noted that the numbers of substrates proceed during the DOE split run may be any number greater than 2. After the DOE split run, all the film layers formed on different sample substrates are then transferred through several metrology tools to run a series of measurement/detection processes to determine the film properties of the film layer formed on the sample substrates.

Subsequently, in sub-block 207, the film properties as measured from the film layers formed on the sample substrates are then analyzed and compared through the statistical process control module. Similar to the sub-block 205, a senor to sensor response calibration is performed to collect, monitor, analyze and compare the measured film properties with the standard value stored in the database. In each split run, at least one of the process parameters or sensor settings (e.g., a variable) is changed so that at least one sensor response corresponding to the process parameter change or sensor setting will be obtained. In one particular example, the sensors selected here to be detected or changed at the DOE split run are considered critical sensors so as to accurately detect the process performance that can enable and execute the process precisely. For example, when a deposition process is performed, the MFC sensor is often one of the critical variables selected to be altered, changed, detected, and included in the DOE split runs, as the gas flow rate that MFC sensor controls during a deposition process often serve as a crucial role that may significantly dominate the film properties after the material layer is deposited and formed. Other examples of the critical sensors may include pressure sensors, temperature sensors, RF sensors or the like.

After the film properties of the deposited material layer is measured, the measured data is then analyzed and compared with the desired standard in the database so as to calculate and monitor the performance of each variable (e.g., critical sensors) set in each DOE split. Analysis of the measured data may indicate mismatch values from the sensor response so as to quickly identify the defective sensor at question from the variables set in each DOE split so as to find mismatch efficiently. When the mismatch is found, the defective sensor is quickly found and identified. Thus, a corresponding sensor calibration or sensor replacement process will perform to calibrate the performance of the specific sensor at question or replace the specific sensor to match to the standard sensor performance as desired. As discussed above, the sensor calibration procedure is an efficient trouble shooting process utilized to quickly identify the defective sensors for replacement and fix, identify process or sensor issues, abnormality or errors occurring in the processing chamber 100. After each sensor response is compared, analyzed and calibrated based on the measured data from the proceeded wafers in the DOE split runs, the sensor calibration procedure utilizing the BKM split process at operation 206 is then considered completed.

The film properties being measured may include at least one or more of film thickness, film uniformity, refractive index, efficient coefficient, film stress, wet etching rate (WER) or dry etching rate, lithography overlay, conductivity, resistivity, density, and the like. After the measurement data is analyzed, a trouble shooting process may be performed, if any data error is found, so as to fix the issues, abnormality or errors occurring in the processing chamber 100 and further to match the processing chamber performance to the desired standard range.

At block 208, based on the analyzed data, a calibration process may be performed to correct chamber parameters as well as process parameters set in the processing chamber and the BKM recipe, respectively. The calibration process may utilize single layer recipe or multilayer recipe as needed. The values of the resultant film properties formed on the substrate after the calibration process may be controlled at a desired range so as to control the process accuracy, matching, consistency, reliability and stability.

FIG. 4 depicts a table listing exemplary film properties set or controlled within a desired tolerance. The tolerance allows for soft limits for process deviation resulting from slight variations from each chamber condition even after the chamber calibration/matching process. For example, each measurement data obtained from the sample substrates from the DOE split run may be controlled within the desired tolerance range, such as within certain percentage of the target value with an upper limit and a lower limit set for the film properties. These upper limits and lower limits of the film properties are set up based on a review of the historical data. When limits are exceeded, a notification in the form of an alert, such as a visual signal in the software system, can be sent to the engineers or fab automation system with notification of a problem in the processing chamber during the calibration process or post calibration process for demanding further chamber calibration/matching process.

After all the film properties from the sample substrates from the DOE split run all fall in the desired range/limit set in the table of FIG. 4, the overall chamber matching/calibration process, including the hardware matching procedures identified in bracket 210 and the on-water result matching procedures identified in bracket 212 in FIG. 2, is then considered completed and the matching process is fulfilled.

In the event wherein the hardware matching procedures 210 and the on-water result matching procedures 212 in FIG. 2 have been completed but some mismatch is still present in the processing chamber 100, an additional set of chamber sensors may be installed in the processing chamber 100 to obtain additional information. The additional set of chamber sensors may be different from the sensors existing in the processing chamber 100. Alternatively, the additional set of chamber sensors may be similar to the sensors already existing in the processing chamber 100, but with more advanced control and detection. For example, if a conventional MFC could not detect a flow rate fault, a digital MFC with higher sensitivity may be optionally utilized to help diagnosis of the issues at question for chamber calibration and matching. After the additional set of chamber sensors are installed in the processing chamber 100, the BKM process may be once again performed to transmit signals to the controller 110 in the processing chamber 100. The controller 110 may then again analyzing the received signal and sensor response to determine and quickly identity the defective sensors to be fine-tuned or adjusted to the processing chamber 100 or the BKM process as needed.

Embodiment of the present disclosure provides a methodology for determining a baseline in a processing chamber and efficiently matching the processing chamber performance to a standard requirement set in a manufacturing production line. The hardware matching procedures along with the on-wafer result matching procedures in the methodology efficiently and quickly identify the mismatched items occurred during a process, so as to quickly identify the defective sensors based on the sensor response obtained so as to calibrate and correct the mismatch in the processing chamber. Thus, the likelihood of process deviation generated from chamber performance mismatch among the processing chambers may be efficiently eliminated and reduced, thus promoting process accuracy.

While the foregoing is directed to embodiments of the present disclosure, other and further embodiments of the disclosure may be devised without departing from the basic scope thereof, and the scope thereof is determined by the claims that follow.

What is claimed is:

1. A method for calibrating a plasma processing chamber for semiconductor manufacturing process, comprising:
   performing a first predetermined plasma process in a plasma processing chamber;
   maintaining a desired gas pressure in the plasma processing chamber;
   collecting a first set of signals transmitted from a first group of sensors disposed in the plasma processing chamber to a controller while performing the predetermined process;
   analyzing the collected first set of signals;
   comparing the collected first set of signals with database stored in the controller of the plasma processing chamber to check sensor responses from the first group of sensors;
   calibrating sensors based on the collected first set of signals when a mismatch sensor response is found;
   subsequently performing a first series of plasma processes including at least two processes in the processing chamber, wherein the first series of processes comprises multiple processes including the process parameters set in the first predetermined process, 20% above and below of the process parameters set in the first predetermined process, and 10% above and below of the process parameters set in the first predetermined process; and
   collecting a second set of signals transmitted from the sensors to the controller while performing the series of plasma processes in the plasma processing chamber.

2. The method of claim 1, further comprising: performing a second series of plasma processes on a group of substrates transferred in the plasma processing chamber respectively; and
   forming a film layer on each substrate in the group with different film properties.

3. The method of claim 2, further comprising:
   measuring film properties of each film layer disposed in each substrate; comparing the film properties with the database stored in the controller to check sensor responses from the first group of sensors; and calibrating the first group of sensors in the processing chamber based on the measured film properties when a mismatch sensor response is found.

4. The method of claim 3, wherein the film properties measured from the film layers formed on the substrates include at least one of film thickness, film uniformity, refractive index, efficient coefficient, film stress, wet etching rate (WER) or dry etching rate, lithography overlay, conductivity, resistivity, density.

5. The method of claim 3, further comprising:
implementing a second group of chamber sensors in the processing chamber.

6. The method of claim 5, further comprising: performing the first predetermined process in the plasma processing chamber;
collecting a third set of signals transmitted from the second group of sensors.

7. The method of claim 6, further comprising:
analyzing the third set of the signals by the controller to check sensor response from the second group of sensors;
comparing the sensor response with the database stored in the controller; and
calibrating the second group of sensors in the processing chamber when a mismatch is found.

8. The method of claim 2, further comprising:
measuring film properties of each film layer disposed in each substrate; and
calibrating process parameters set in the first predetermined process based on the measured film properties when a mismatch sensor response is found.

9. The method of claim 2, wherein the second series of processes comprises multiple processes including the process parameters set in the first predetermined process, 20% above and below of the process parameters set in the first predetermined process, and 10% above and below of the process parameters set in the first predetermined process.

10. The method of claim 1, wherein the first predetermined process is a BKM process set for the processing chamber.

11. The method of claim 1, wherein the first predetermined process comprises a single layer recipe or multi-layer recipes.

12. A non-transitory computer-readable storage medium storing a program, which, when executed by a processor performs an operation for operating a processing chamber, the operation comprising:
performing a first hardware calibration process by calibrating sensors in a plasma processing chamber based on sensor responses collected and analyzed from operating a first predetermined process in the plasma processing chamber;
performing a second hardware calibration process by calibrating the sensors in the processing chamber based on sensor responses collected and analyzed from operating a first set of processes including at least two processes in the processing chamber,
wherein the first set of processes comprises multiple processes including the process parameters set in the first predetermined process, 20% above and below of the process parameters set in the first predetermined process, and 10% above and below of the process parameters set in the first predetermined process; and
maintaining a desired gas pressure in the plasma processing chamber while performing the first and the second hardware calibration processes.

13. The computer-readable storage medium of claim 12, further comprising:
performing a on-wafer result calibration process by adjusting process parameters set in the first predetermined process or sensors in the plasma processing chamber based on data collected and analyzed from film layers formed on a group of substrates having a second set of processes performed on each substrate in the group respectively disposed in the plasma processing chamber.

14. The computer-readable storage medium of claim 13, wherein the second set of processes comprises § multiple processes including the process parameters set in the first predetermined process, 20% above and below of the process parameters set in the first predetermined process, and 10% above and below of the process parameters set in the first predetermined process.

15. The computer-readable storage medium of claim 12, further comprising a software having a data library stored therein for data comparison and analysis.

16. A processing system, comprising:
a controller coupled to a plasma processing chamber, the controller comprising a system memory containing instructions and a processor, the processor configured to cause the plasma processing chamber to perform a method when executing the instructions, the method comprising:
receiving a first set of signals transmitted from a plasma processing chamber when performing a first predetermined process in the plasma processing chamber;
analyzing the collected first set of signals;
comparing the collected first set of signals with database stored in the controller to check sensor responses from the first group of sensors;
calibrating sensors based on the collected first set of signals when a mismatch sensor response is found;
subsequently performing a first series of processes including at least two processes in the processing chamber, wherein the first set of processes samples run at process parameters set by the first predetermined process, set about 20% above and below of the process parameters set by the first predetermined process, and set about 10% above and below of the process parameters set in the first predetermined process;
maintaining a desired gas pressure in the plasma processing chamber while performing the first series of processes; and
collecting a second set of signals transmitted from the sensors to the controller while performing the series of processes.

17. The processing system of claim 16, wherein the second set of processes samples run at process parameters set by the first predetermined process, set about 20% above and below of the process parameters set by the first predetermined process, and set about 10% above and below of the process parameters set in the first predetermined process.

* * * * *